United States Patent
Behfar et al.

(10) Patent No.: US 8,014,434 B2
(45) Date of Patent: Sep. 6, 2011

(54) MULTIPLE CAVITY ETCHED-FACET DFB LASERS

(75) Inventors: Alex Behfar, Irvine, CA (US); Malcolm Green, Lansing, NY (US); Norman Kwong, San Marino, CA (US); Cristian Stagaresen, Ithaca, NY (US)

(73) Assignee: Binoptics Corporation, Ithaca, NY (US)

( * ) Notice: Subject to any disclaimer, the term of this patent is extended or adjusted under 35 U.S.C. 154(b) by 60 days.

(21) Appl. No.: 12/208,988

(22) Filed: Sep. 11, 2008

(65) Prior Publication Data
US 2009/0067465 A1 Mar. 12, 2009

Related U.S. Application Data

(60) Provisional application No. 60/960,014, filed on Sep. 11, 2007.

(51) Int. Cl.
*H01S 3/08* (2006.01)
(52) U.S. Cl. .......... 372/96; 372/50.11; 372/50.12; 372/97; 372/102
(58) Field of Classification Search .......... 372/96, 372/97, 102, 50.11, 50.12
See application file for complete search history.

(56) References Cited

U.S. PATENT DOCUMENTS

| | | | |
|---|---|---|---|
| 4,674,096 A * | 6/1987 | Salzman et al. | 372/50.12 |
| 4,730,327 A | 3/1988 | Gordon | |
| 4,993,036 A * | 2/1991 | Ikeda et al. | 372/50.12 |
| 5,231,642 A * | 7/1993 | Scifres et al. | 372/45.01 |
| 5,963,568 A | 10/1999 | Paoli | |
| 6,104,739 A | 8/2000 | Hong et al. | |
| 6,810,053 B1 * | 10/2004 | Botez et al. | 372/45.01 |
| 7,113,526 B2 * | 9/2006 | Evans et al. | 372/23 |
| 7,245,645 B2 * | 7/2007 | Behfar et al. | 372/50.1 |
| 7,643,207 B2 * | 1/2010 | Dagens et al. | 359/344 |
| 2001/0017376 A1 | 8/2001 | Verdiell | |
| 2004/0190580 A1 * | 9/2004 | Pezeshki et al. | 372/96 |
| 2005/0083982 A1 * | 4/2005 | Behfar | 372/50 |
| 2007/0019960 A1 * | 1/2007 | Kuwata et al. | 398/118 |

* cited by examiner

*Primary Examiner* — Jessica T Stultz
*Assistant Examiner* — Yuanda Zhang
(74) *Attorney, Agent, or Firm* — Jones, Tullar & Cooper, PC

(57) ABSTRACT

A semiconductor chip has at least two DFB etched facet laser cavities with one set of facets with AR coatings and a second set of etched facets with HR coatings that have a different relative position with respect to the gratings. This creates a difference in the phase between each of the etched facets and the gratings which changes the operational characteristics of the two laser cavities such that at least one of the lasers provides acceptable performance. As a result, the two cavity arrangement greatly improves the yield of the fabricated chips.

21 Claims, 5 Drawing Sheets

MULTIPLE CAVITY ETCHED-FACET DFB LASERS

CROSS REFERENCE TO RELATED APPLICATIONS

This application claims the benefit of U.S. Provisional Application No. 60/960,014, which was filed on Sep. 11, 2007 and is hereby incorporated by reference in its entirety.

FIELD OF THE INVENTION

The present invention relates, in general, to etched-facet photonic devices, and more particularly to multiple cavity etched-facet DFB laser devices.

BACKGROUND OF THE INVENTION

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxy structure having an active layer parallel to the substrate surface. The wafer is then processed with a variety of semiconductor processing tools to produce a laser optical cavity incorporating the active layer and incorporating metallic contacts attached to the semiconductor material. Laser facets typically are formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. Since the semiconductor material is cleaved to form the laser facets, the locations and orientations of the facets are limited; furthermore, once the wafer has been cleaved, it typically is in small pieces so that conventional lithographical techniques cannot readily be used to further process the lasers.

The foregoing and other difficulties resulting from the use of cleaved facets led to the development of a process for forming the mirror facets of semiconductor lasers through etching. This process, as described in U.S. Pat. No. 4,851,368, the disclosure of which is hereby incorporated herein by reference, also allows lasers to be monolithically integrated with other photonic devices on the same substrate. This work was further extended and a ridge laser process based on etched facets was disclosed in the IEEE Journal of Quantum Electronics, volume 28, No. 5, pages 1227-1231, May 1992, and U.S. application Ser. No. 11/356,203 the disclosures of which are hereby incorporated herein by reference.

Distributed feedback (DFB) lasers use a distributed diffraction grating to generate a single wavelength output. The relative position of the facets and the grating are of critical importance in the performance of these lasers, as discussed by Streifer, et al. in a paper entitled "Effect of External Reflectors on Longitudinal Modes of Distributed Feedback Lasers," IEEE Journal of Quantum Electronics, Volume QE-11, pages 154 to 161, April 1975. Unfortunately, cleaved facets can only be placed within a desired position only to a few microns causing random phase variation between the facets and the grating, and are therefore unpredictable in laser performance and characteristics. As such, these lasers have a limited yield by design.

The key performance characteristics for DFB lasers are whether the device operates in a single longitudinal mode (SLM) and whether it has a high side mode suppression ratio (SMSR). The impact of this phase variation on yield is discussed by Kinoshita, et al. in a paper entitled: "Yield analysis of SLM DFB lasers with an axially-flattened internal field," IEEE Journal of Quantum Electronics, Volume QE-25, pages 1324 to 1332, June 1989, and David, et al. in a paper entitled: "Gain-coupled DFB lasers versus index-coupled and phase shifted DFB lasers: a comparison based on spatial hole burning corrected yield," IEEE Journal of Quantum Electronics, Volume QE-27, pages 1714 to 1723, June 1991.

DFB lasers can be processed with photolithographically defined etched facets, but the alignment accuracy of the photolithographic system together with the angular misalignment between the placement of the grating and the etched facet is insufficient to deterministically specify the phase between the facet and the grating across a wafer. Since high yield DFB lasers are extremely desirable, an improved structure and method for making etched-facet semiconductor DFB lasers are needed which address the foregoing issues.

SUMMARY OF THE INVENTION

The present invention addresses the foregoing issues through provision of an improved structure and method for making etched-facet semiconductor DFB lasers in which at least two DFB laser cavities per chip are formed at close proximity to each other. The cavities are configured such that the first cavity forms a first phase with a diffraction grating and the second cavity forms a second different phase with the diffraction grating. In the preferred embodiment, this phase difference is achieved by making the length of one of the laser cavities slightly longer than the length of the other cavity. Since the relative position of the facets between two closely positioned cavities can be accurately determined in etched facet lasers, by changing the cavity length by a small amount in one of the two laser cavities, the phase between the facet and the diffraction gratings of the DFB lasers will be at or closer to the desired range for one of the at least two lasers. In actual practice of the invention, this arrangement has resulted in a significant increase in chip yield.

In the preferred embodiments, in order to package the chip with relative ease, a minimum chip size is required of approximately 250 µm by 250 µm, although even smaller chips may be packaged. Given this area, the two DFB cavities can be formed in the same chip footprint or in a slightly larger footprint than a single DFB cavity.

BRIEF DESCRIPTION OF THE DRAWINGS

The foregoing and additional features and advantages of the present invention will be apparent to those of skill in the art from the following detailed description of preferred embodiments thereof, taken in conjunction with the accompanying drawings, which are briefly described as follows.

DETAILED DESCRIPTION OF THE PREFERRED EMBODIMENT

Figure 1:
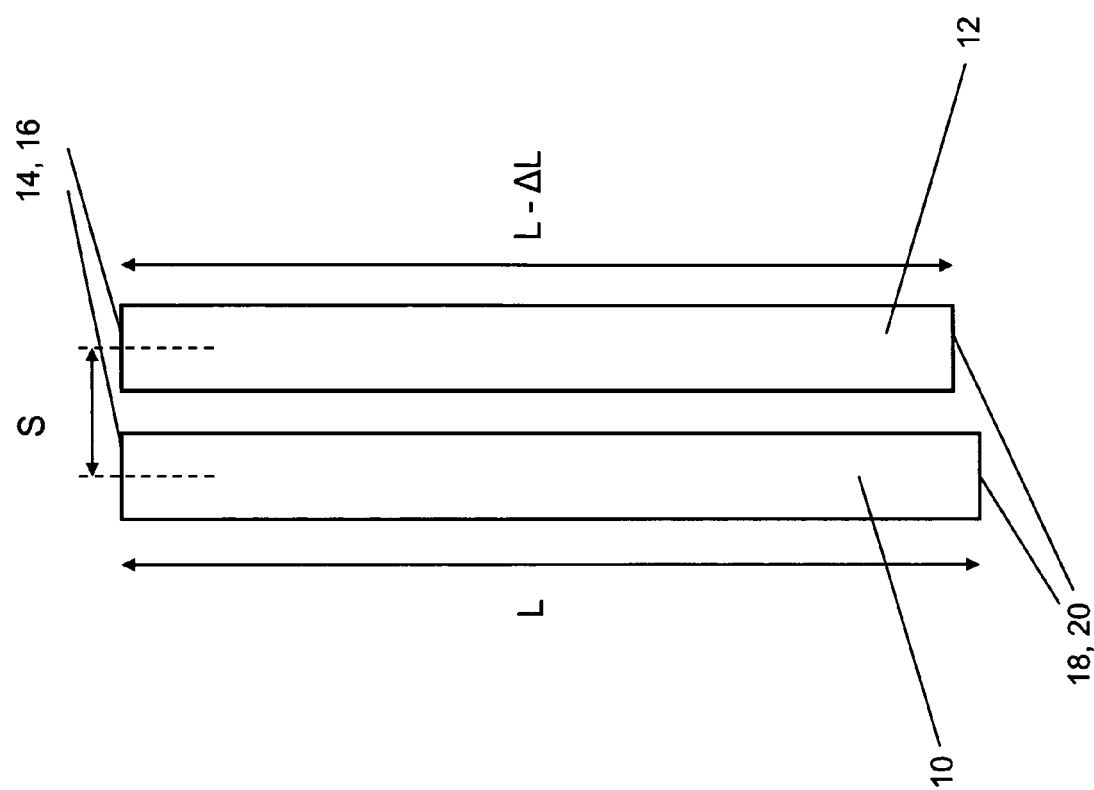
FIG. 1 is a graphical depiction of two etched facet laser cavities which are selected to have a relative difference in their lengths in accordance with the preferred embodiment of the present invention. The sizes of the cavities are not shown to scale in this or the other figures in order to be able to illustrate the concept of the invention.

The present invention can be applied to a DFB semiconductor laser structure to improve the yield during manufacture thereof. The details of the inventive concept are provided herein following a discussion of the known laser structures and fabrication techniques which are preferably employed in the invention. As is conventional, in the fabrication of solid state ridge lasers, the substrate may be formed, for example, of a type III-V compound or an alloy thereof, which may be suitably doped. The substrate includes a top surface on which is deposited, as by an epitaxial deposition such as Metalorganic Chemical Vapor Deposition (MOCVD), a succession of layers which form an optical cavity that includes an active region. Typically, the grating layer will be near the active region (above or below) and will be patterned with a periodic structure through e-beam lithography, holographic lithography, or nano-imprint technology followed by etching to form the gratings in the grating layer.

The deposition system is used to grow the remainder of the laser structure on top of the gratings in the grating layer and provide the distributed feedback in the DFB laser structure. The DFB semiconductor laser structure contains upper and lower cladding regions, formed from lower index semiconductor material than the active region, such as InP, adjacent to the active region. The active region may be formed with InAlGaAs-based quantum wells and barriers. A transition layer of InGaAsP may be formed on the top surface of the upper cladding layer. An InGaAs contact layer may be used on top of the InGaAsP transition layer. The grating layer is typically formed on InGaAsP with a bandgap corresponding to a wavelength longer than the lasing wavelength of the laser.

For example, a DFB laser can be of the ridge type or of the buried heterostructure type and both structures would experience increased yield with the invention described here within. Details of design and fabrication of various types of DFB lasers can be found, for example, in the book entitled: "Handbook of Distributed Feedback Laser Diodes," by Morthier, et al., published by Artech House, Inc., 1997.

One of the most common DFB structures is one that has a simple grating that periodically modulates the real index of reflection. However, if these lasers were to have perfect antireflection (AR) coatings on both facets, they would have degeneracy into two modes symmetric to the Bragg frequency, and the SMSR would be very low. This is discussed in Kogelnik, et al., "Coupled-wave theory of distributed feedback lasers," Journal of Applied Physics, vol. 43, no. 5, pp. 2327-2335, 1972. One of the ways to overcome this degeneracy is to high-reflectivity (HR) coat one of the facets and AR coat the other. However, since cleaved facets can only be positioned to a positional accuracy of a few microns, the uncertainty of the phase between the grating and the cleaved facet causes a yield issue. This is discussed in J. Buus, "Mode selectivity in DFB lasers with cleaved facets," Electronic Letters, vol. 21, pp. 179-180, 1985.

Figure 2:
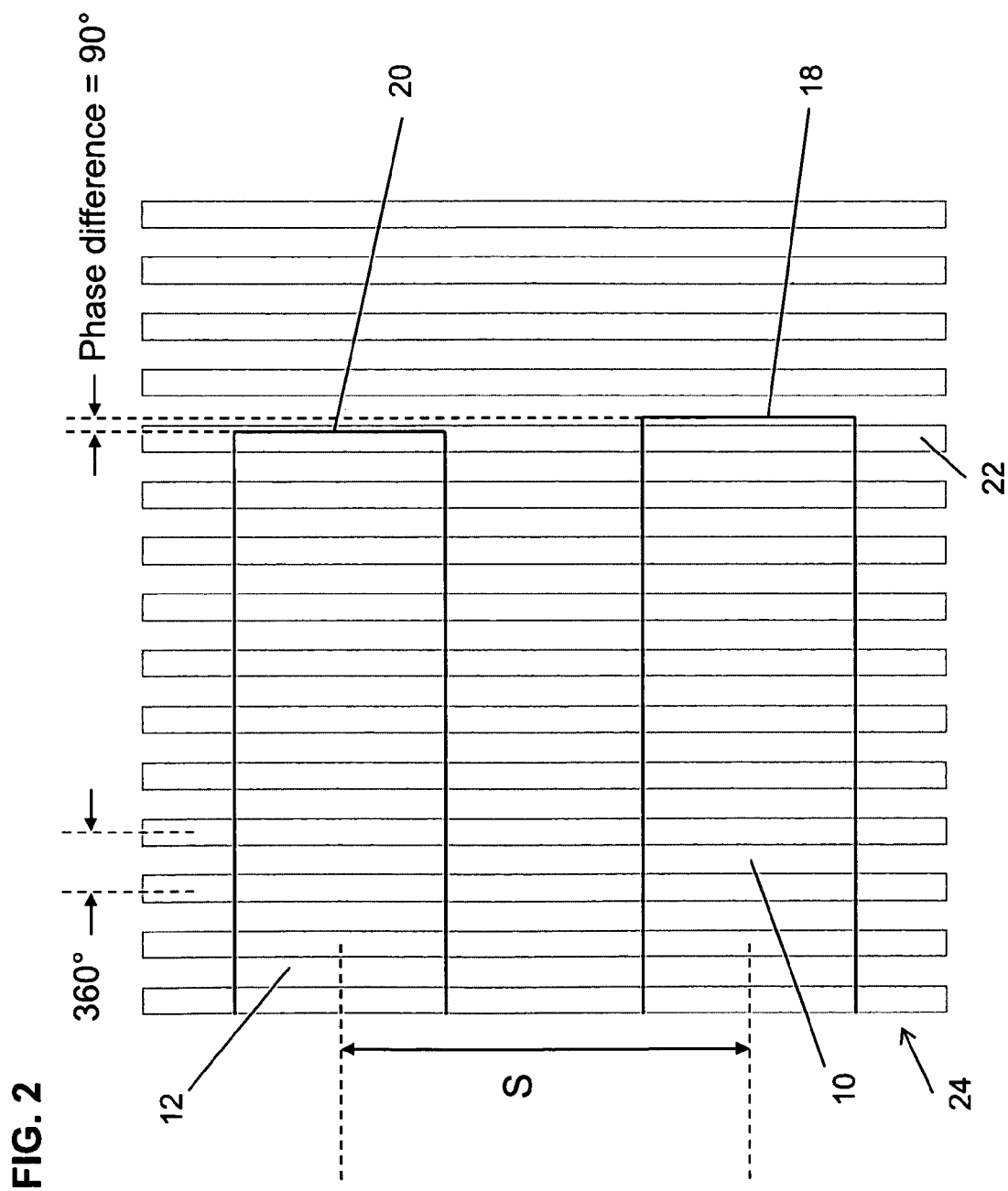
FIG. 2 illustrates how the two etched facet laser cavities of FIG. 1 with a relative difference in their lengths cause a phase difference between an optical grating and each of the etched facets of the laser cavities. For convenience, the cavities are shown without any angular misalignment between the grating and the etched facets that would normally be present due to limitations of known fabrication techniques.

In a working implementation of the present invention that was constructed, at least two closely positioned distributed feedback (DFB) semiconductor laser cavities 10 and 12 were fabricated on a substrate, as illustrated diagrammatically in FIGS. 1 and 2, using etched facet processing with a DFB epitaxial material. The front facets 14 and 16 are shown to be at the same relative position and are AR coated. The first laser 10 has a cavity length of L and the second laser 12 has a cavity length of L−ΔL. As a result, the rear facets 18 and 20 are at a different relative position to each other. This causes a difference in phase between each of the rear facets 18 and 20 and a grating 22 of a diffraction grating structure 24 as illustrated in FIG. 2.

The resolution of the lithography system that was used is 365 nm and the overlay accuracy is within 70 nm. However, the relative placement of two front facets 14 and 16 with respect to the grating structure 24 of the two closely spaced laser cavities 10 and 12 can be controlled to better than 20 nm by design and through the use of high resolution photolithographic masks. The angular misalignment between the gratings 22 and the etched facets 14, 16, 18 and 20 sets the limit on how close the laser cavities 10 and 12 need to be for good control over relative placement of etched facets.

This technique was used to build a large number of closely spaced dual cavity etched facet DFB lasers of L=250, 300 and 350 μm and ΔL=0.1 μm. This difference in cavity length corresponds to a nominal value of 176° phase change between the facet and the grating of the two lasers for the wavelength of around 1310 nm and effective index for the laser of around 3.2. The grating pitch Λ is equal to $\lambda/(2n_{\it eff})$, where λ is the wavelength in free space and $n_{\it eff}$ is the effective index. The phase change is calculated by using $2\pi(\Delta L/\Lambda)$. The spacing S between the centers of the two laser waveguides was 20 μm, but angular misalignment between the grating pattern and the facets can reduce or increase the contribution to the phase change from the nominal value. It will be understood that larger or smaller spacings can be used. As illustrated in FIG. 1, the front facets 14 and 16 are AR coated facets and are shown to be at the same relative position while the rear facets 18 and 20 are HR coated facets having a relative difference in position. This difference in relative position results in a different phase between the facet and the grating and is illustrated in FIG. 2 with a 90° phase difference.

Twenty four pairs of DFB cavities were fabricated, one in the pair having a cavity length of L and the other in the pair having a cavity length of L−ΔL. Pairs 1 to 8 had L=250 μm, pairs 9 to 16 had L=300 μm, and pairs 17 to 24 had L=350 μm, and ΔL=0.1 μm. For example, in pair 1 the left laser 1a had a nominal cavity length of 250.0 μm while the right laser 1b had a nominal cavity length of 249.9 μm.

Figure 3:
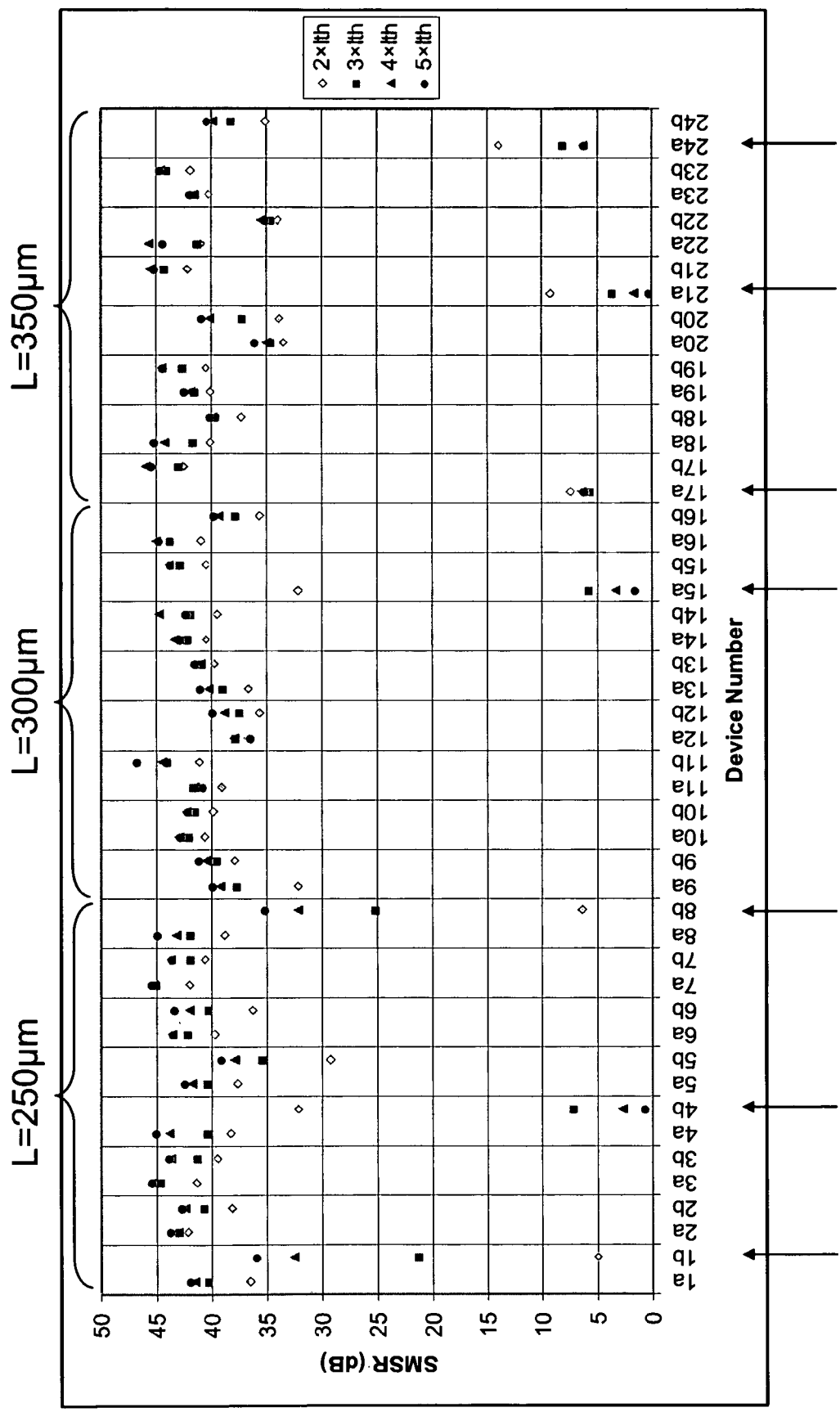
FIG. 3 is a graph depicting experimentally obtained side mode suppression ratio (SMSR) data at different multiples of threshold current for pairs of lasers with small differences in the cavity lengths within each pair in accordance with the preferred embodiment of the invention.

These 48 DFB lasers were tested and the results are shown in FIG. 3. The SMSR was measured at currents applied to the laser of 2 to 5 times the laser threshold current, Ith. A SMSR of above 30 dB is considered good. From this data, one can see that at least one of the two devices in the device pairs operates with a SMSR that is greater than 30 dB. For example, pair 1 shows the DFB laser 1a was good while 1b was bad. In FIG. 3, all the devices with the bad SMSR are indicated with an arrow.

Figure 4:
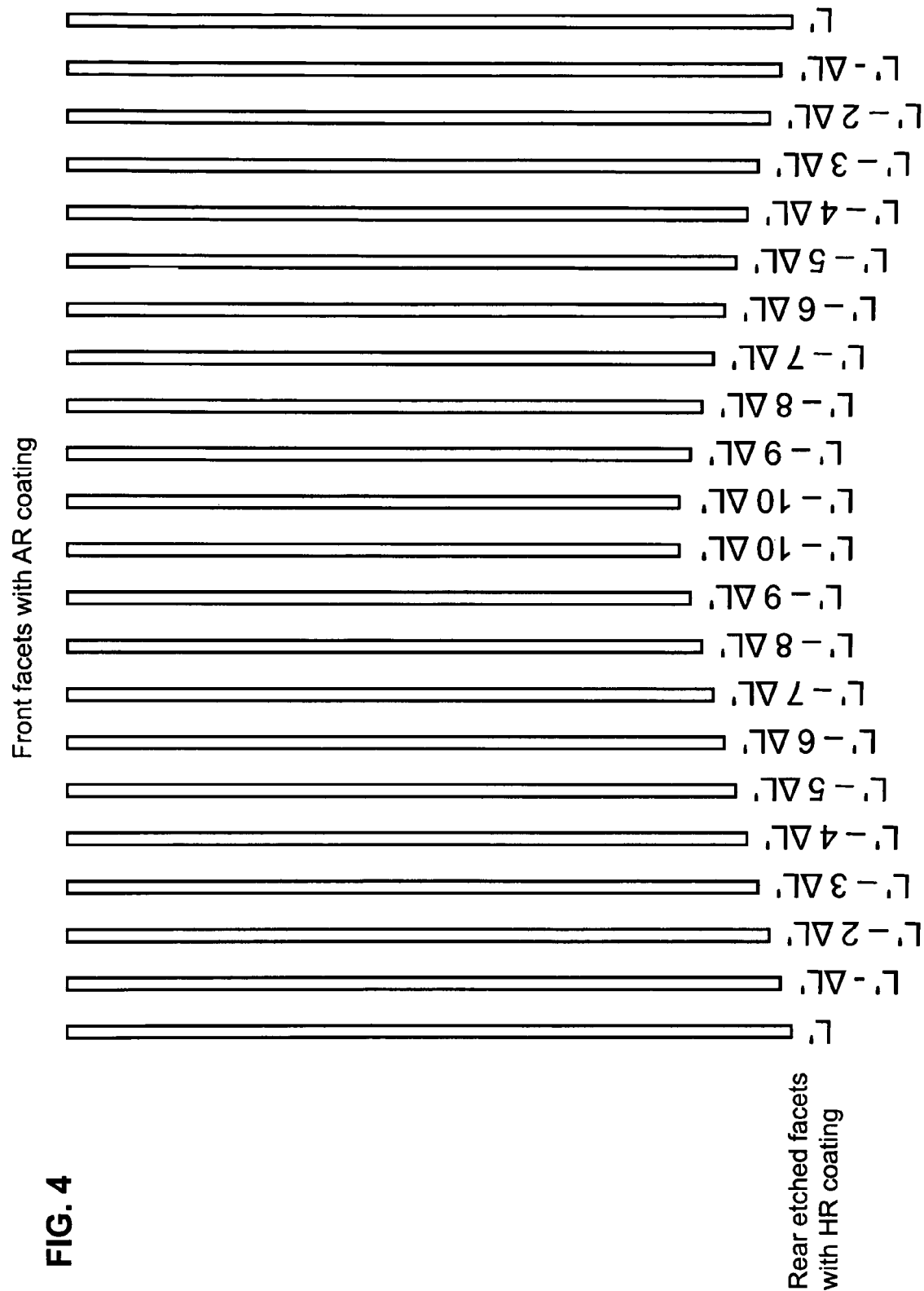
FIG. 4 shows an experimental setup used to obtain results using the concept of the invention which employed 20 lasers with small differences in cavity length between adjacent lasers on a left-hand-side array of 10 and small differences in cavity length between adjacent lasers on a right-hand-side array of 10.

In another experiment, multiple cavities were formed as illustrated in FIG. 4. Here ΔL' is the difference between two cavities that were adjacent to each other for the 10 devices on the left-hand-side of the experiment or the right-hand-side of the experiment. ΔL' was set at 20 nm corresponding to a nominal phase difference between the grating and the adjacent facets of 35.2°. Interestingly, by comparing the left-hand-side and right-hand-side, the angular misalignment between the etched facets and the grating can be determined. Experimental results show that for a significant difference in SMSR between adjacent devices, at least a 30° phase difference is needed and preferably this value is around 90°.

The experiments prove that the chip yield for a dual DFB laser cavity structure, such as that in FIG. 1, is higher than the chip yield for a single DFB laser cavity. This is because the probability that one of the two cavities in the pair meeting the SMSR requirement is high.

Figure 5:
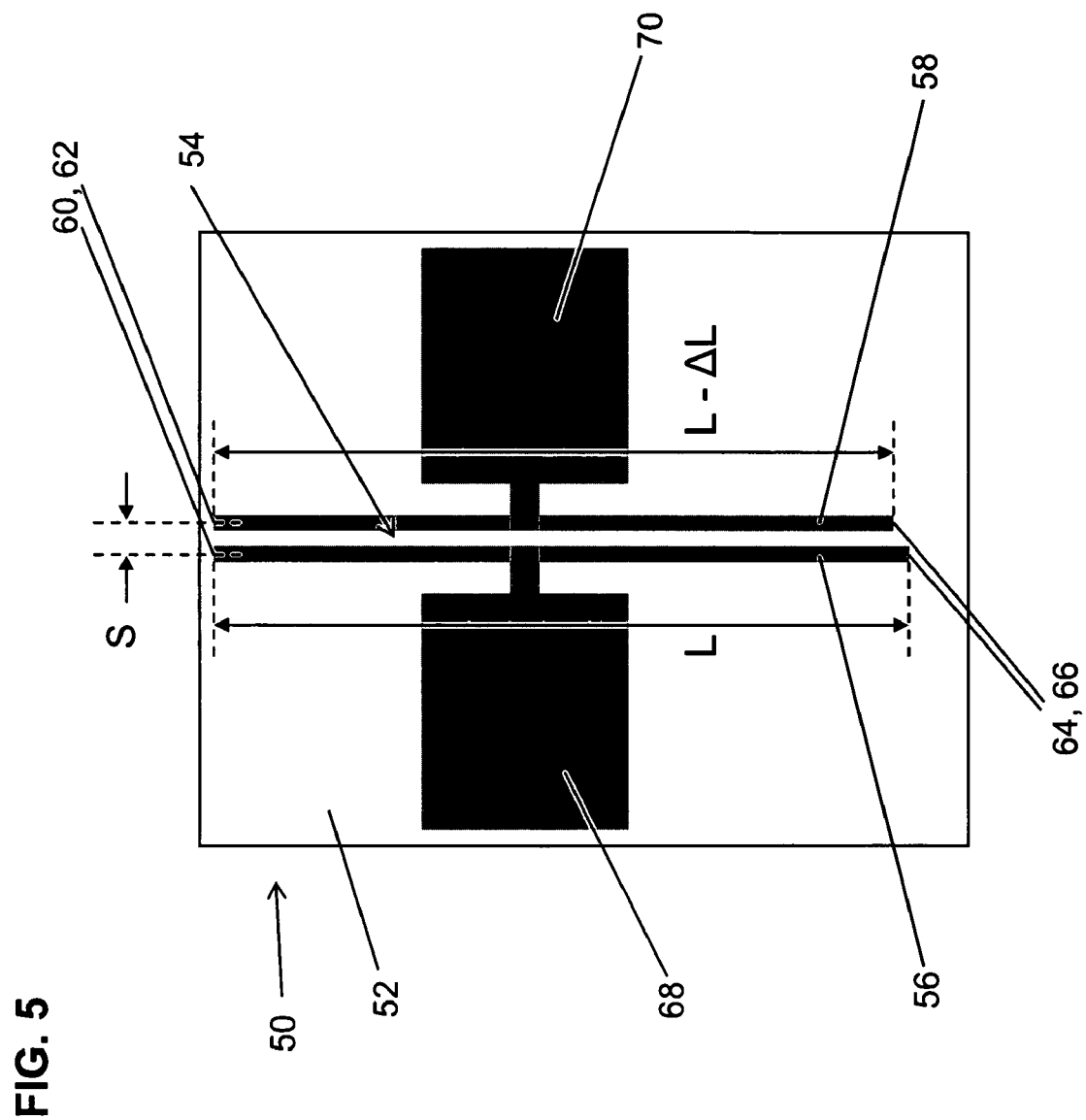
FIG. 5 illustrates a semiconductor chip constructed in accordance with the preferred embodiment which includes two etched facet DFB lasers with a relative difference in their cavity lengths and electrical contacts for selectively supplying current to each of the lasers.

FIG. 5 illustrates a semiconductor chip 50 that is constructed in accordance with the preferred embodiment of the present invention. The chip 50 includes a substrate 52 on which is formed a dual cavity DFB laser structure 54. The laser structure 54 includes first and second laser cavities 56 and 58 which are configured as in FIG. 1. The cavities 56 and 58 therefore include AR coated etched facets 60 and 62 at their front ends and HR coated etched facets 64 and 66 at their rear ends.

During fabrication, an electrical contact layer is formed over the laser structure 54 (which includes the cavities 56, 58 and the diffraction grating 24 from FIG. 2). Much of the contact layer is then removed to form first and second contact pads 68 and 70 which are used to supply current to the first and second laser cavities 56 and 58, respectively.

The chip 50 of FIG. 5 or any other chip with at least two laser cavities with different relative phase between the rear etched facets can be packaged into, for example, a TO-type can and one of the at least two lasers can be selectively wirebonded inside the package to provide electrical current to that laser. Typically, a TO-type package will have a lens and the lens can be aligned to the laser. Here, the lens can be aligned to the laser that has received the wirebond.

It is not essential that the front or AR coated two facets 14 and 16 be at same relative position as is shown in FIG. 1, however, it is important to have relative position difference between the two rear or HR coated facets 18 and 20. As an alternative to the structure described above, since the two front facets may be at the same relative position, they could be formed using cleaving, while the rear facets could be formed through etching.

A new type of surface emitting semiconductor laser can also be fabricated. This laser is known as a Horizontal Cavity Surface Emitting Laser (HCSEL™) and was disclosed in U.S. application Ser. Nos. 10/958,069 filed Oct. 5, 2004 and 10/963,739 filed Oct. 14, 2004, the disclosures of which is hereby incorporated herein by reference. As detailed in these applications, the HCSEL has a facet that is etched at or around 45° to the substrate. The reflective surface that defines one end of the cavity is above this etched facet and may have the contact layer removed to reduce absorption. A dual cavity DFB HCSEL can replace the DFB edge emitting laser that was described above, and also benefit from the increase in chip yield.

Assuming that the patterning of etched facets and the actual position of etched facets can be accurately located, for example, for a 1310 nm DFB laser, it is expected that a lithography system with much better resolution than 365 nm would be able to perform the patterning of the grating and allow the etched facet to be located with enough accuracy so that the phase of the mirrors or facets are known within a few degrees. This could also result in high yield DFB lasers.

However, if the lithography systems do not have such capabilities, the present invention would allow significant increase in chip yield using more than a single DFB cavity per chip, with different relative phase between the rear etched facets of the lasers on the chip and the grating.

Although the present invention has been illustrated in terms of a preferred embodiment and variations thereon, it will be understood that other variations and modifications may be made without departing from the scope thereof as set forth in the following claims.

The invention claimed is:

1. A semiconductor chip, comprising:
a substrate;
an epitaxial laser structure on said substrate, said epitaxial laser structure including a grating layer;
a periodic grating formed in said grating layer;
at least first and second independent distributed feedback laser cavities formed in said epitaxial structure, said first and second laser cavities being spaced apart from one another in said epitaxial structure;
said first distributed feedback laser cavity having a first etched facet defining a first end of said first distributed feedback laser cavity and forming a first phase with said grating; and
said second distributed feedback laser cavity having a first etched facet defining a first end of said second distributed feedback laser cavity and forming a second phase with said grating, said second phase being different than the first phase,
whereby the likelihood of at least one of said first and second laser cavities being operational is increased.

2. The semiconductor chip of claim 1, wherein said first etched facets are high-reflection coated.

3. The semiconductor chip of claim 1, wherein said first and second laser cavities each has a second facet formed through etching.

4. The semiconductor chip of claim 3, wherein the second facet of each of said first and second laser cavities is etched at an angle of about 45 degrees to said substrate.

5. The semiconductor chip of claim 4, wherein a surface above said second facet of each of said first and second laser cavities is anti-reflection coated.

6. The semiconductor chip of claim 4, wherein said epitaxial laser structure further comprises a semiconductor contact layer and said semiconductor contact layer is removed from above said second facet of each of said first and second laser cavities.

7. The semiconductor chip of claim 6, wherein said semiconductor contact layer is formed of InGaAs.

8. The semiconductor chip of claim 6, wherein a surface above said second facet of each of said first and second laser cavities is anti-reflection coated.

9. The semiconductor chip of claim 3, wherein said second etched facet of each of said first and second laser cavities are perpendicular to said substrate.

10. The semiconductor chip of claim 3, wherein said second facet of each of said first and second laser cavities are anti-reflection coated.

11. The semiconductor chip of claim 1, wherein said chip is incorporated in a package and wherein at least one of said first and second laser cavities receives electrical current though a wirebond.

12. The semiconductor chip of claim 11, wherein a lens in said package is aligned with said at least one laser cavity receiving electrical current through a wirebond.

13. The semiconductor chip of claim 1, wherein said first and second laser cavities each has one cleaved facet.

14. The semiconductor chip of claim 13, wherein said cleaved facets are anti-reflection coated.

15. The semiconductor chip of claim 14, wherein said first etched facets are high-reflection coated.

16. The semiconductor chip of claim 1, wherein said first and second laser cavities each has a length; and the length of said first laser cavity is different from the length of said second laser cavity.

17. A semiconductor chip, comprising:
   a substrate;
   an epitaxial laser structure on said substrate;
   said epitaxial laser structure having a grating layer with a periodic grating of pitch $\Lambda$ formed therein;
   at least first and second independent distributed feedback laser cavities formed in said epitaxial structure, said first and second laser cavities spaced apart from one another in said epitaxial structure;
   said first distributed feedback laser cavity having a first length and a first etched facet defining a first end of said first distributed feedback laser cavity that forms a first phase with said grating; and
   said second distributed feedback laser cavity having a second length and a first etched facet defining a first end of said first distributed feedback laser cavity that forms a second phase with said grating;
   wherein said first and second lengths are different from one another and said first and second phases are different from one another.

18. The semiconductor chip of claim 17, wherein said first and said second lengths differ from one another by less than $\Lambda$ and greater than zero.

19. The semiconductor chip of claim 18, wherein said first and said second lengths differ from one another by less than $3\Lambda/4$ and greater than or equal to $\Lambda/4$.

20. The semiconductor chip of claim 17, wherein said chip is incorporated in a package and wherein at least one of said first and second laser cavities receives electrical current though a wirebond.

21. The semiconductor chip of claim 20, wherein a lens in said package is aligned with said at least one laser cavity receiving electrical current through a wirebond.

* * * * *